(12) United States Patent
    Wyville

(10) Patent No.: US 9,036,732 B2
(45) Date of Patent: May 19, 2015

(54) MODELING TRANSMITTER AND/OR TRANSMIT OBSERVATION RECEIVER FREQUENCY RESPONSE AND UTILIZATION THEREOF

(71) Applicant: Telefonaktiebolaget L M Ericsson (publ), Stockholm (SE)

(72) Inventor: Mark Wyville, Ottawa (CA)

(73) Assignee: Telefonaktiebolaget L M Ericsson (publ), Stockholm (SE)

(*) Notice: Subject to any disclaimer, the term of this patent is extended or adjusted under 35 U.S.C. 154(b) by 107 days.

(21) Appl. No.: 13/734,238

(22) Filed: Jan. 4, 2013

(65) Prior Publication Data

US 2014/0192922 A1    Jul. 10, 2014

(51) Int. Cl.
   *H04B 1/62*     (2006.01)
   *H04B 1/04*     (2006.01)
   *H04B 1/40*     (2006.01)

(52) U.S. Cl.
   CPC .. *H04B 1/62* (2013.01); *H04B 1/04* (2013.01); *H04B 1/40* (2013.01)

(58) Field of Classification Search
   CPC ............... H04B 1/04; H04B 1/40; H04B 1/62
   USPC .................................................. 375/295, 296
   See application file for complete search history.

(56) References Cited

U.S. PATENT DOCUMENTS

2013/0165060 A1* 6/2013 Jian et al. .................... 455/114.3

OTHER PUBLICATIONS

Schreurs, Dominique et al., "RF Power Amplifier Behavioral Modeling", The Cambridge RF and Microwave Engineering Series, Cambridge University Press, 2009, pp. 145-157, Cambridge, UK.

* cited by examiner

*Primary Examiner* — Leila Malek
(74) *Attorney, Agent, or Firm* — Withrow & Terranova, PLLC

(57) ABSTRACT

Systems and methods for training, or calibrating, a model of a frequency response of a transmitter and/or a model of a frequency response of a transmit observation receiver coupled to an output of the transmitter are disclosed. In one embodiment, in order to train a model of the frequency response of the transmitter and/or a model of the frequency response of the transmit observation receiver, a nonlinear component is connected between an output of the transmitter and an input of the transmit observation receiver. A combined model for the frequency response of the transmitter, a nonlinear characteristic of the nonlinear component, and the frequency response of the transmit observation receiver is then trained. Preferably, once the combined model is trained, the nonlinear component is disconnected for normal operation of the transmitter and the transmit observation receiver.

26 Claims, 7 Drawing Sheets

US 9,036,732 B2

MODELING TRANSMITTER AND/OR TRANSMIT OBSERVATION RECEIVER FREQUENCY RESPONSE AND UTILIZATION THEREOF

FIELD OF THE DISCLOSURE

The present disclosure relates to modeling a frequency response of a transmitter and/or a frequency response of a transmit observation receiver coupled to an output of the transmitter and utilizing the model(s) to improve performance of the transmitter.

BACKGROUND

FIG. 1 illustrates a conventional system 10 that that includes a transmitter 12 and a transmit observation receiver (TOR) 14 coupled to an output of the transmitter 12 via a coupler 16. As illustrated, the transmitter 12 includes a digital predistorter (DPD) 18, a Digital-to-Analog Converter (DAC) 20, an upconversion subsystem 22, and a power amplifier (PA) 24 connected as shown. An output of the transmitter 12 (i.e., an output of the PA 24) is coupled to an antenna 26 via a transmit (TX) filter 28. The output of the PA 24 is also coupled to an input of the TOR 14 via the coupler 16. The TOR 14 includes a downconversion subsystem 30 and an Analog-to-Digital Converter (ADC) 32 connected as shown. An output of the TOR 14 is coupled to a first input of a subtractor 34. The input of the transmitter 12 is coupled to an input of a delay and gain adjustment component 36, and an output of the delay and gain adjustment component 36 is coupled to a second input of the subtractor 34.

In operation, a baseband processor 38 sends a digital transmit signal to the input of the transmitter 12. The digital transmit signal is predistorted by the DPD 18 to compensate for nonlinearity of the PA 24, converted from digital to analog by the DAC 20, upconverted to a desired radio frequency by the upconversion subsystem 22, and amplified by the PA 24 to provide a radio frequency transmit signal at the output of the transmitter 12. The radio frequency transmit signal is filtered by the transmit filter 28, and the resulting filtered radio frequency transmit signal is transmitted via the antenna 26. The TOR 14 samples the radio frequency transmit signal output by the transmitter 12 to provide a digital TOR output signal at the output of the TOR 14. The subtractor 34 then subtracts a gain and delay adjusted version of the digital transmit signal input to the transmitter 12 from the digital TOR output signal to provide an error signal that represents a residual Inter-Modulation Distortion (IMD) in the radio frequency transmit signal output by the transmitter 12. The error signal can then be utilized by the baseband processor 38 to, for example, adaptively configure the DPD 18 to compensate for the nonlinearity of the PA 24.

The delay and gain adjustment component 36 can accurately model a path between the input of the transmitter 12 and the output of the TOR 14 for conventional transmit signals. However, for modern and future wireless communications standards, the transmit signals have or will have significantly wider bandwidths. For wideband transmit signals, the delay and gain adjustment component 36 is not capable of accurately modeling the path between the input of the transmitter 12 and the output of the TOR 14. In particular, the delay and gain adjustment component 36 is not capable of accurately modeling a path between the output of the transmitter 12 and the output of the TOR 14 for wideband transmit signals. More specifically, a frequency response of the TOR 14 varies significantly over the bandwidth of the wideband transmit signals. As a result, if only the delay and gain adjustment component 36 is used to model the path between the input of the transmitter 12 and the output of the TOR 14 for wideband transmit signals, the performance of the transmitter 12 will suffer (e.g., the baseband processor 38 will take longer to adapt the DPD 18). As such, there is a need for a model of the frequency response of the TOR 14 for wideband transmit signals.

SUMMARY

Systems and methods for training, or calibrating, a model of a frequency response of a transmitter and/or a model of a frequency response of a transmit observation receiver (TOR) coupled to an output of the transmitter are disclosed. In one embodiment, in order to train a model of the frequency response of the transmitter and/or a model of the frequency response of the TOR, a nonlinear component is connected between an output of the transmitter and an input of the TOR. A combined model for the frequency response of the transmitter, a nonlinear characteristic of the nonlinear component, and the frequency response of the TOR is then trained. The combined model is a concatenation of a first linear filter ($H_1(z)$) that is a model of the frequency response of the transmitter, a quasi-memoryless nonlinearity ($f(\bullet)$) that is a model of the nonlinear characteristic of the nonlinear component, and a second linear filter ($H_2(z)$) that is a model of the frequency response of the TOR. The combined model is a three-box model known as a Wiener-Hammerstein model. Preferably, once the combined model is trained, the nonlinear component is disconnected for normal operation of the transmitter and the TOR.

In addition, systems and methods for utilizing a model of a frequency response of a transmitter and/or a model of a frequency response of a TOR coupled to an output of the transmitter to improve a performance of the transmitter are disclosed. In one embodiment, an inverse of the model of the frequency response of the TOR is applied to an output signal of the TOR during normal operation. In another embodiment, an inverse of the model of the frequency response of the transmitter is applied to an input signal of the transmitter during normal operation.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
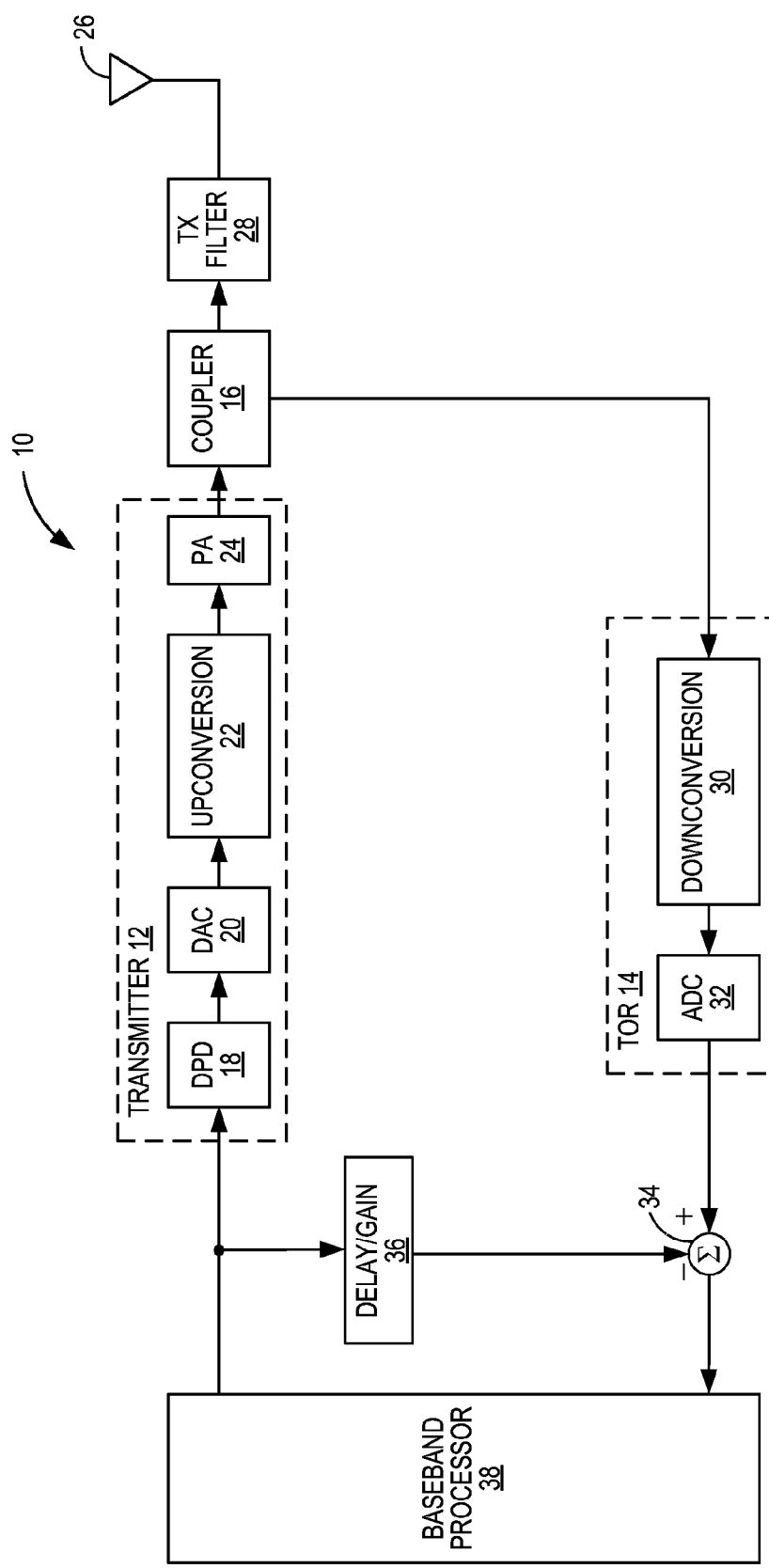
FIG. 1 illustrates a system that includes a conventional transmitter and transmit observation receiver (TOR)
Figure 2:
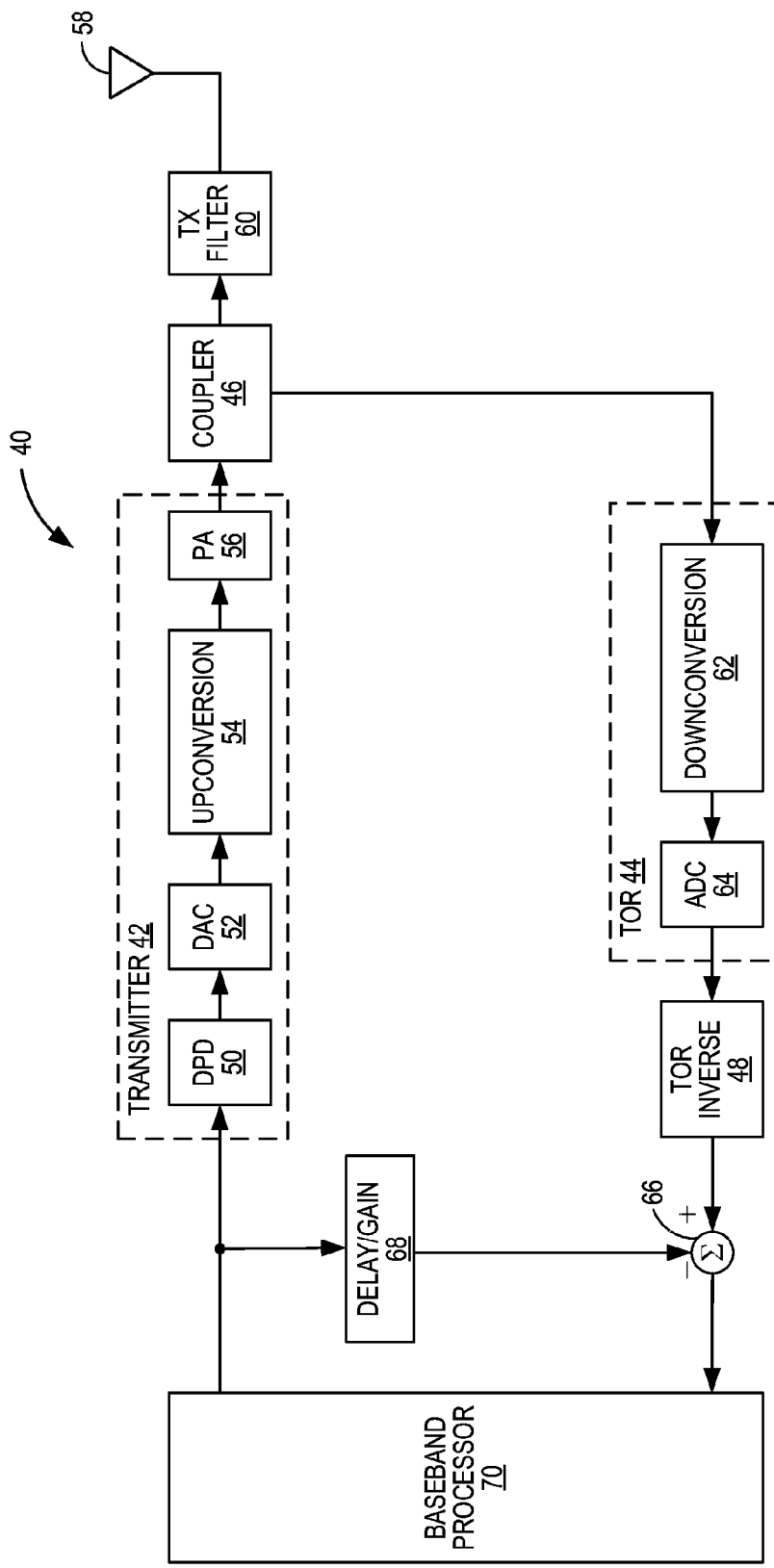
FIG. 2 illustrates a system that includes a transmitter, a TOR, and a TOR inverse model component that compensates for a varying frequency response of the TOR over a desired observation bandwidth according to one embodiment of the present disclosure.
Figure 3:
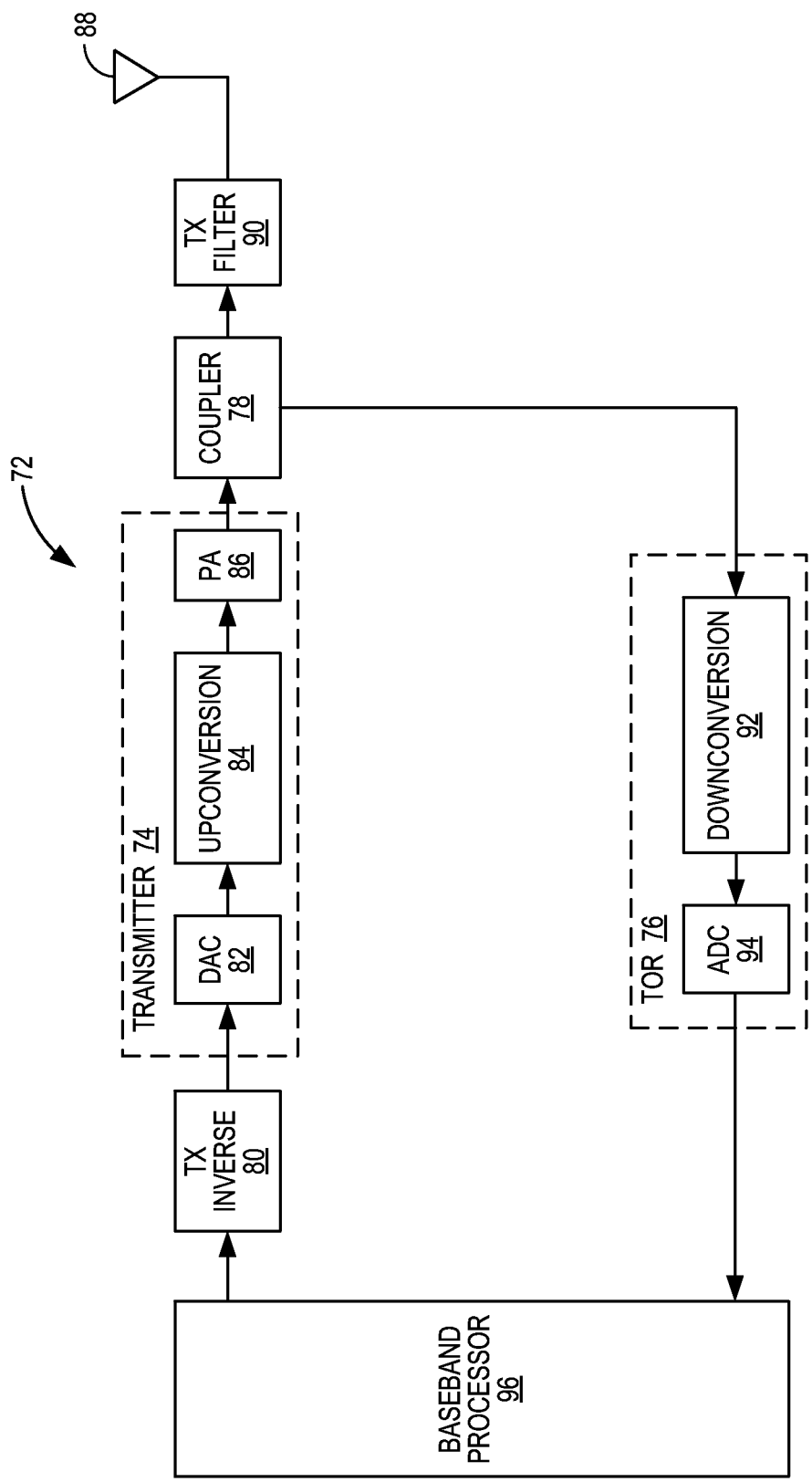
FIG. 3 illustrates a system that includes a transmitter, a TOR, and a transmitter inverse model component that compensates for a varying frequency response of the transmitter over a desired bandwidth according to one embodiment of the present disclosure.
Figure 6:
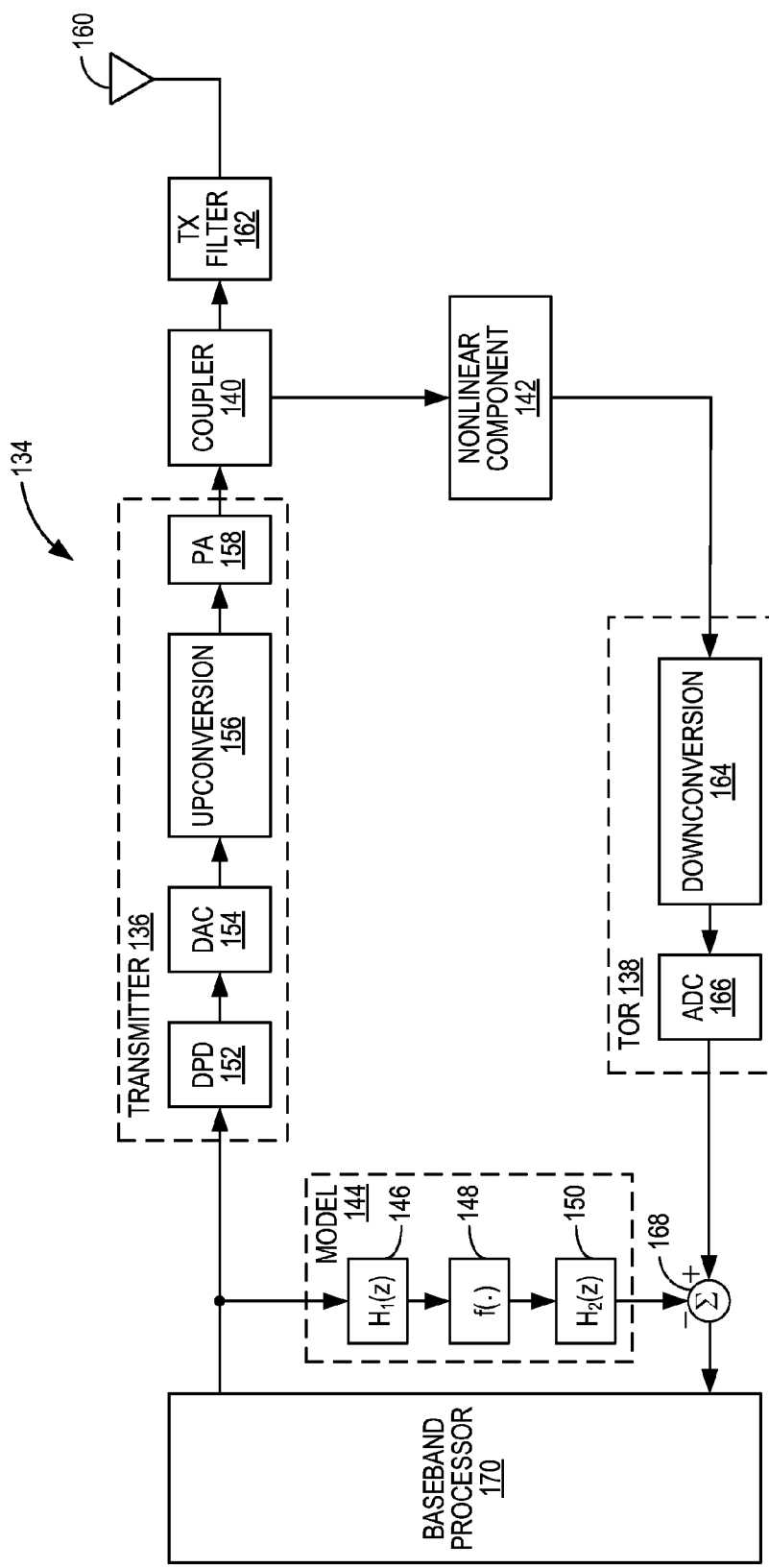
Figure 7:
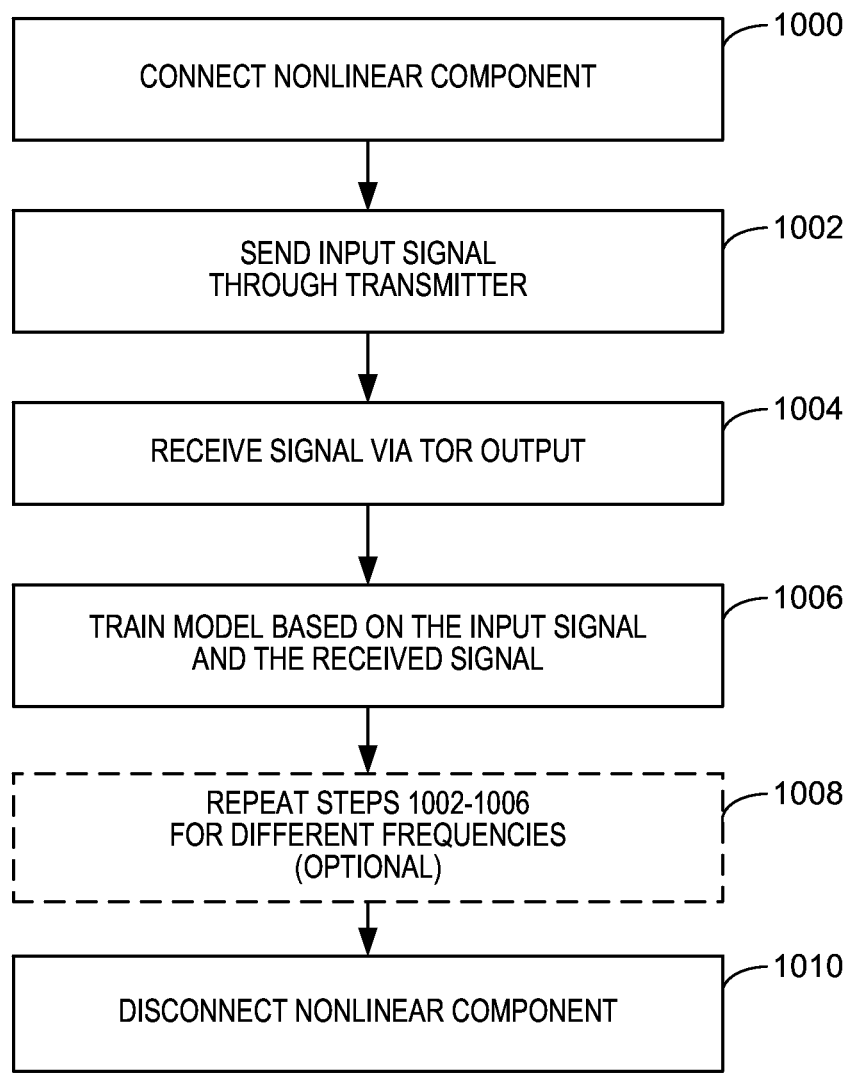

FIG. 6 illustrates a system similar to that of FIG. 2 or FIG. 3 in which a nonlinear component is connected between an output of the transmitter and an input of the TOR, where the system is configured to train a model of a frequency response of the transmitter and/or a model of a frequency response of the TOR according to yet another embodiment of the present disclosure; and FIG. 7 is a flow chart that illustrates a process for training a model of a frequency response of a transmitter and/or a model of a frequency response of a TOR coupled to an output of the transmitter according to one embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Systems and methods for training, or calibrating, a model of a frequency response of a transmitter and/or a model of a frequency response of a transmit observation receiver (TOR) coupled to an output of the transmitter are disclosed. However, before describing systems and methods for training, or calibrating, a model of a frequency response of a transmitter and/or a model of a frequency response of a TOR coupled to an output of the transmitter, two exemplary systems for utilizing the models to improve performance of a transmitter are disclosed. Note, however, that these systems for utilizing the models are only examples and are not intended to limit the scope of the present disclosure.

In this regard, FIG. 2 illustrates a system 40 that includes a transmitter 42 and a TOR 44 coupled to an output of the transmitter 42 via a coupler 46, wherein a model of a frequency response of the TOR 44 is utilized to improve a performance of the transmitter 42 according to one embodiment of the present disclosure. In particular, a TOR inverse model component 48 applies an inverse of the model of a frequency response of the TOR 44 to a digital TOR output signal output by the TOR 44 to thereby frequency equalize the frequency response of the TOR 44. As a result, performance of the transmitter 42 is substantially improved.

As illustrated, the transmitter 42 includes a digital predistorter (DPD) 50, a Digital-to-Analog Converter (DAC) 52, an upconversion subsystem 54, and a power amplifier (PA) 56 connected as shown. An output of the transmitter 42 (i.e., an output of the PA 56) is coupled to an antenna 58 via a transmit (TX) filter 60. The output of the PA 56 is also coupled to an input of the TOR 44 via the coupler 46. The TOR 44 includes a downconversion subsystem 62 and an Analog-to-Digital Converter (ADC) 64 connected as shown. An output of the TOR 44 is coupled to an input of the TOR inverse model component 48, and an output of the TOR inverse model component 48 is coupled to a first input of a subtractor 66. The input of the transmitter 42 is coupled to an input of a delay and gain adjustment component 68, and an output of the delay and gain adjustment component 68 is coupled to a second input of the subtractor 66. Notably, while the TOR inverse model component 48 is illustrated as a separate block in FIG. 2, the TOR inverse model component 48 (and the subtractor 66 and the delay and gain adjustment component 68) may alternatively be implemented within a baseband processor 70.

In operation, the baseband processor 70 sends a digital transmit signal to the input of the transmitter 42. The digital transmit signal is predistorted by the DPD 50 to compensate for nonlinearity of the PA 56, converted from digital to analog by the DAC 52, upconverted to a desired radio frequency by the upconversion subsystem 54, and amplified by the PA 56 to provide a radio frequency transmit signal at the output of the transmitter 42. The radio frequency transmit signal is filtered by the transmit filter 60, and the resulting filtered radio frequency transmit signal is transmitted via the antenna 58. The TOR 44 samples the radio frequency transmit signal output by the transmitter 42 to provide a digital TOR output signal at the output of the TOR 44. More specifically, the radio frequency transmit signal obtained from the output of the PA 56 via the coupler 46 is downconverted, preferably to baseband, by the downconversion subsystem 62 and analog to digital converted by the ADC 64 to thereby provide the digital TOR output signal at the output of the TOR 44.

The digital TOR output signal is passed through the TOR inverse model component 48 to provide a frequency-equalized digital TOR output signal. By passing the digital TOR output signal through the TOR inverse model component 48, the frequency-equalized digital TOR output signal is as if the frequency response of the TOR 44 were flat, or essentially flat, over a desired observation bandwidth. Note that a "frequency-equalized" signal, such as the frequency-equalized digital TOR output signal, refers to a signal that has passed through a channel with a flat response over the desired bandwidth. A "flat" response refers to a magnitude response and a group delay response, which are independent of frequency. In one embodiment, the desired observation bandwidth is a bandwidth of a desired transmit signal within the radio frequency transmit signal output by the transmitter 42. However, the desired observation bandwidth is not limited thereto.

The delay and gain adjustment component 68 applies delay and gain adjustments to the digital transmit signal to provide an adjusted digital transmit signal. Preferably, the delay and gain adjustments are configured to model a path from the input of the transmitter 42 to the output of the transmitter 42. The subtractor 66 subtracts the adjusted digital transmit signal from the frequency-equalized digital TOR output signal to provide an error signal that represents a residual InterModulation Distortion (IMD) in the radio frequency transmit signal output by the transmitter 42. In this embodiment, the error signal is provided to the baseband processor 70 where the error signal is utilized to adaptively configure the DPD 50 to compensate for the nonlinearity of the PA 56 by minimizing, or at least reducing, the residual IMD.

FIG. 3 illustrates a system 72 that includes a transmitter 74 and a TOR 76 coupled to an output of the transmitter 74 via a coupler 78, wherein a model of a frequency response of the transmitter 74 is utilized to improve a performance of the transmitter 74 according to one embodiment of the present disclosure. In particular, a transmitter inverse model component 80 applies an inverse of the model of a frequency response of the transmitter 74 to a digital transmit signal input to the transmitter 74 to thereby frequency equalize the frequency response of the transmitter 74. As a result, performance of the transmitter 74 is substantially improved.

As illustrated, the transmitter 74 includes a DAC 82, an upconversion subsystem 84, and a PA 86 connected as shown. Notably, while not illustrated, the transmitter 74 may include a DPD prior to the DAC 82. An output of the transmitter 74 (i.e., an output of the PA 86) is coupled to an antenna 88 via a transmit filter 90. The output of the PA 86 is also coupled to an input of the TOR 76 via the coupler 78. The TOR 76 includes a downconversion subsystem 92 and an ADC 94 connected as shown. In this embodiment, an output of the TOR 76 is coupled to an input of a baseband processor 96.

In operation, the baseband processor 96 sends a digital transmit signal to an input of the transmitter inverse model component 80. The transmitter inverse model component 80 passes the digital transmit signal through an inverse of a model of the frequency response of the transmitter 74 to thereby provide an adjusted digital transmit signal at an output of the transmitter inverse model component 80. By passing the adjusted digital transmit signal through the transmitter 74, the output of the transmitter 74 is frequency-equalized. Notably, while the transmitter inverse model component 80 is illustrated as a separate block in FIG. 3, the transmitter inverse model component 80 may alternatively be implemented within the baseband processor 96. The adjusted digital transmit signal is converted from digital to analog by the DAC 82, upconverted to a desired radio frequency by the upconversion subsystem 84, and amplified by the PA 86 to provide a radio frequency transmit signal at the output of the transmitter 74. The radio frequency transmit signal is filtered by the transmit filter 90, and the resulting filtered radio frequency transmit signal is transmitted via the antenna 88. By passing the digital transmit signal through the transmitter inverse model component 80, the radio frequency transmit signal is as if the frequency response of the transmitter 74 were flat, or essentially flat, over a desired transmit bandwidth. The desired transmit bandwidth is a bandwidth of a desired transmit signal within the radio frequency transmit signal output by the transmitter 74.

The TOR 76 samples the radio frequency transmit signal output by the transmitter 74 to provide a digital TOR output signal at the output of the TOR 76. More specifically, the radio frequency transmit signal obtained from the output of the PA 86 via the coupler 78 is downconverted, preferably to baseband, by the downconversion subsystem 92 and analog to digital converted by the ADC 94 to thereby provide the digital TOR output signal at the output of the TOR 76. The baseband processor 96 then utilizes the digital TOR output signal to provide a desired function. As one example, the digital TOR output signal may be used to adapt a digital predistortion subsystem of the transmitter 74. The digital predistortion subsystem may be used to linearize the transmitter 74 (e.g., compensate for a nonlinearity of the transmitter 74 such as, for instance, a nonlinearity of the PA 86). As another example, the digital TOR output signal may be used to measure the frequency response of the transmitter 74.

Notably, the transmitter inverse model component 80 of FIG. 3 may be particularly beneficial for PA architectures where the PA 86 includes multiple parallel amplifier branches (e.g., a Doherty amplifier architecture). In this case, the paths, or branches, of the PA 86 can be frequency-equalized in the digital domain using the inverse of both of their transmitter frequency responses. Equalizing these paths improves performance especially as signal bandwidth increases.

In order for the embodiment of FIG. 2 to operate, the model of the frequency response of the TOR 44 must be trained, or calibrated. Likewise, in order for the embodiment of FIG. 3 to operate, the model of the frequency response of the transmitter 74 must be trained, or calibrated. However, conventional techniques used to measure the frequency response of a channel, or path, that starts and ends in the digital domain are incapable of isolating the frequency response of the transmitter 42, 74 from the frequency response of the TOR 44, 76 unless either the frequency response of the transmitter 42, 74 or the frequency response of the TOR 44, 76 is already known. As such, conventional techniques require that either the frequency response of the transmitter 42, 74 or the frequency response of the TOR 44, 76 be determined using calibrated radio frequency test equipment (e.g., a calibrated radio frequency receiver such as a radio frequency signal analyzer that receives the radio frequency transmit signal output by the transmitter 42, 74 in response to a test signal input to the transmitter 42, 74 or a calibrated radio frequency signal generator that generates a radio frequency test signal to input into the TOR 44, 76). However, it is desirable to measure the frequency responses of the transmitter 42, 74 and the TOR 44, 76 without the use of radio frequency test equipment, which would require test points on the circuit board for the transmitter 42, 74 and the TOR 44, 76 (i.e., connectors to connect the radio frequency test equipment).

Figure 4:
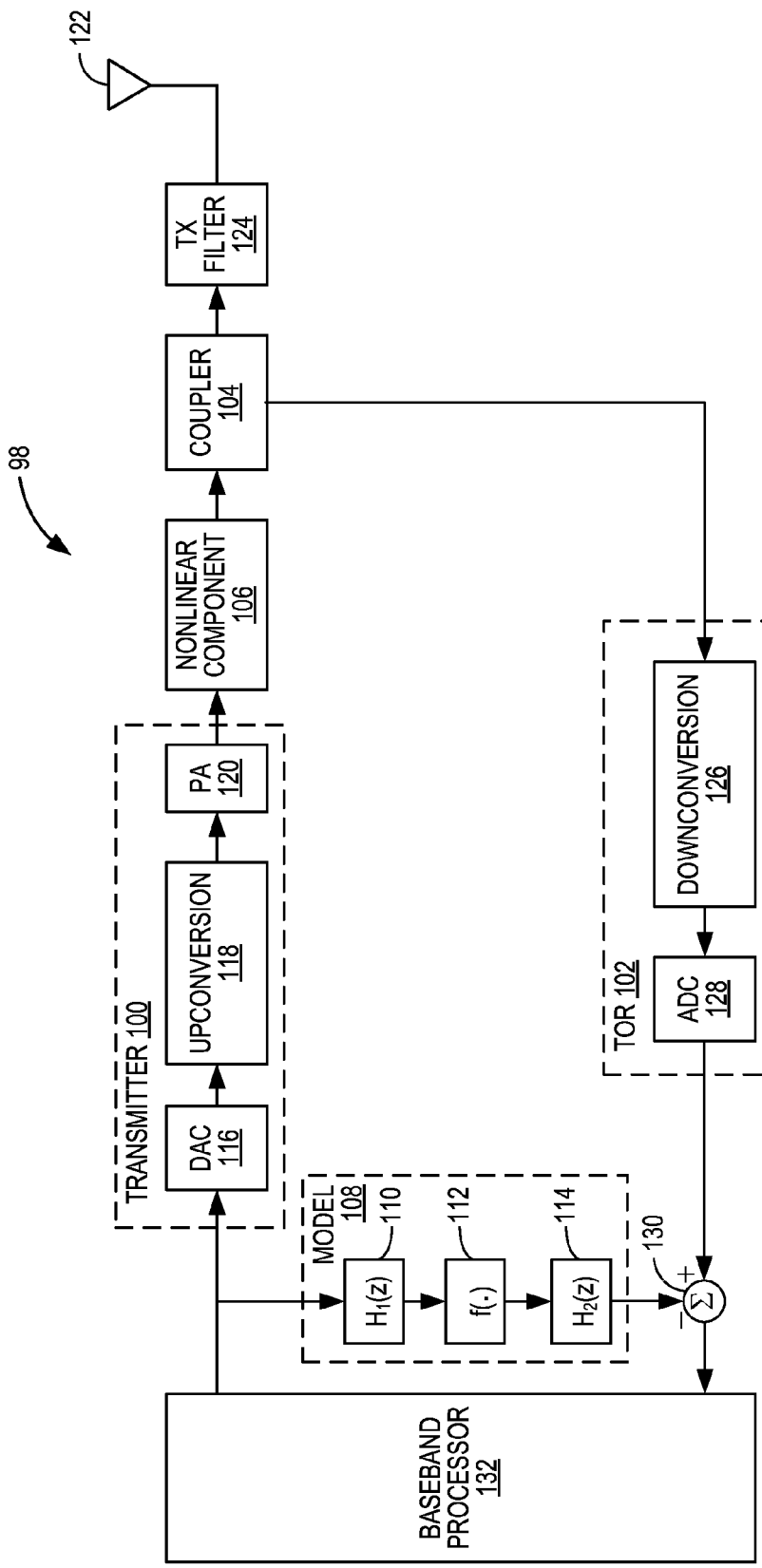
FIG. 4 illustrates a system similar to that of FIG. 2 or FIG. 3 in which a nonlinear component is connected between an output of the transmitter and an input of the TOR, where the system is configured to train a model of a frequency response of the transmitter and/or a model of a frequency response of the TOR according to one embodiment of the present disclosure.

FIGS. 4-7 illustrate systems and methods for training models of a frequency response of a transmitter and a frequency response of a TOR coupled to the output of the transmitter without the use of radio frequency test equipment according to several embodiments of the present disclosure. In this regard, FIG. 4 illustrates a system 98 including a transmitter 100 and a TOR 102 coupled to an output of the transmitter 100 via a coupler 104 in which a nonlinear component 106 is connected between the output of the transmitter 100 and the coupler 104 to enable training of a model of a frequency response of the transmitter 100 and a model of a frequency response of the TOR 102 according to one embodiment of the present disclosure. In one embodiment, the system 98 is the system 40 of FIG. 2 that is configured for a training mode by connecting the nonlinear component 106 between the output of the transmitter 42 and the coupler 46 and decoupling or deactivating the DPD 50 (FIG. 2). After training, the system 40 is reconfigured for a normal mode by disconnecting the nonlinear component 106 and re-coupling or re-activating the DPD 50. In another embodiment, the system 98 is the system 72 of FIG. 3 that is configured for a training mode by connecting the nonlinear component 106 between the output of the transmitter 74 and the coupler 78 (FIG. 3). After training, the system 72 is reconfigured for a normal mode by disconnecting the nonlinear component 106. The nonlinear component 106 is connected and disconnected between the output of the transmitter 100 and the coupler 104 using any suitable technique. For example, in one embodiment, the nonlinear component 106 is connected and disconnected via one or more switches. As another example, the nonlinear component 106 is connected via soldering or similar technique and disconnected by physically removing the nonlinear component 106 or otherwise destroying the connection made via soldering.

A frequency response of the transmitter 100, a nonlinear characteristic of the nonlinear component 106, and a frequency response of the TOR 102 are modeled by a combined model 108. The combined model 108 is a 3-box model that is a concatenation or cascade of a model of a first linear filter ($H_1(z)$) 110, a model of a quasi-memoryless nonlinearity ($f(\bullet)$) 112, and a model of a second linear filter ($H_2(z)$) 114. As used herein, the term quasi-memoryless corresponds to memory with very short time constants such as, for example, reactive parts (i.e., capacitance and inductance) inherent to any real nonlinear component. Once the combined model 108 is trained, the model of the first linear filter ($H_1(z)$) 110 is a model of the frequency response of the transmitter 100, the model of the quasi-memoryless nonlinearity ($f(\bullet)$) 112 is a model of the nonlinear characteristic of the nonlinear component 106, and the model of the second linear filter ($H_2(z)$) 114 is a model of the frequency response of the TOR 102. The 3-box model forming the combined model 108 is also known as a Wiener-Hammerstein model. Techniques for determining parameters that define the 3-box model (i.e., both filter coefficients for the first and second linear filters ($H_1(z)$ and $H_2(z)$) 110 and 114 and a nonlinearity characteristic of the quasi-memoryless nonlinearity $f(\bullet)$) 112 are known. For example, while not necessary for understanding the present disclosure, one exemplary and non-limiting technique for determining the parameters of the 3-box model is described in Dominique Schreurs et al., "RF Power Amplifier Behavioral Modeling," Cambridge University Press, Cambridge, UK, 2009. Any suitable technique for determining the parameters that define the 3-box model can be used to train the combined model 108 and, more particularly, the models of the first and second linear filters ($H_1(z)$ and $H_2(z)$) 110 and 114, which correspond to the models of the frequency responses of the transmitter 100 and the TOR 102, respectively.

In one embodiment, the nonlinear component 106 is quasi-memoryless. However, in another embodiment, the nonlinear characteristic of the nonlinear component 106 is known and characterized prior to training in which case the nonlinear component 106 may or may not be quasi-memoryless. If the nonlinearity characteristic of the nonlinear component 106 is known and characterized prior to training, training of the combined model 108 is simplified. If the nonlinearity characteristic of the nonlinear component 106 is not known prior to training, the nonlinearity characteristic of the nonlinear component 106 is also determined by training the combined model 108.

As illustrated, the transmitter 100 includes a DAC 116, an upconversion subsystem 118, and a PA 120 connected as shown. An output of the transmitter 100 (i.e., an output of the PA 120) is coupled to an antenna 122 via a transmit filter 124. The output of the PA 120 is also coupled to an input of the TOR 102 via the coupler 104. The TOR 102 includes a downconversion subsystem 126 and an ADC 128 connected as shown. An output of the TOR 102 is coupled to a first input of a subtractor 130. The input of the transmitter 100 is coupled to an input of the combined model 108, and an output of the combined model 108 is coupled to a second input of the subtractor 130.

In order to train the combined model 108, a baseband processor 132 sends one or more digital test signals to the input of the transmitter 100 during a training mode of operation. In this embodiment, the one or more test signals are small signals such that the nonlinear component 106 is a dominant source of IMD in the path from the input of the transmitter 100 to the output of the nonlinear component 106 and the nonlinear distortion of the PA 120 is negligible. The nonlinear component 106 is preferably quasi-memoryless and ideally has a strong nonlinearity. As used herein, a small signal is a signal that is sufficiently small to ensure that the components of the transmitter 100, and in particular the PA 120, operate linearly when processing the signal. In addition, for wideband applications, the one or more test signals include multiple test signals at multiple different frequencies.

For each of the one or more digital test signals, the digital test signal is converted from digital to analog by the DAC 116, upconverted to a desired radio frequency by the upconversion subsystem 118, and amplified by the PA 120 to provide a radio frequency test signal at the output of the transmitter 100. The radio frequency test signal is passed through the nonlinear component 106 to provide a nonlinear component output signal. The nonlinear component output signal is provided to the input of the TOR 102 via the coupler 104. The TOR 102 samples the nonlinear component output signal output by the nonlinear component 106 to provide a digital TOR output signal at the output of the TOR 102. More specifically, the nonlinear component output signal obtained from the output of the nonlinear component 106 via the coupler 104 is downconverted, preferably to baseband, by the downconversion subsystem 126 and analog to digital converted by the ADC 128 to thereby provide the digital TOR output signal at the output of the TOR 102.

The digital TOR output signal is provided to the first input of the subtractor 130. The digital test signal is passed through the combined model 108 to provide an adjusted digital test signal to the second input of the subtractor 130. The subtractor 130 subtracts the adjusted digital test signal from the digital TOR output signal to provide an error signal. The baseband processor 132 processes the error signal to train the combined model 108. Once the combined model 108 is trained, the models of the first and second linear filters ($H_1(z)$ and $H_2(z)$) 110 and 114 correspond to the models of the frequency responses of the transmitter 100 and the TOR 102, respectively. It should be noted that while the combined model 108 is illustrated as a separate block, the combined model 108 (and the subtractor 130) may alternatively be implemented within the baseband processor 132.

Figure 5:
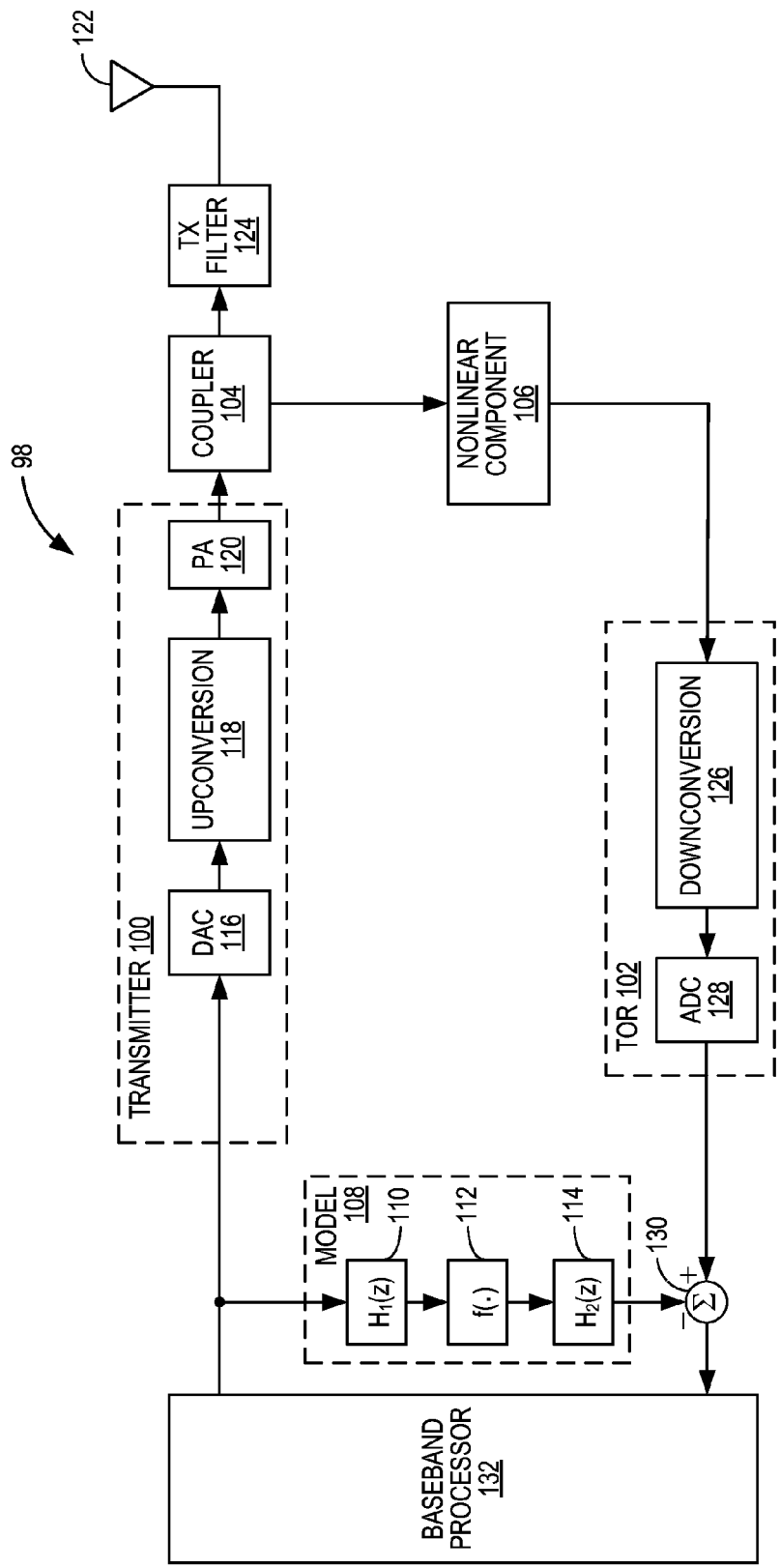
FIG. 5 illustrates a system similar to that of FIG. 2 or FIG. 3 in which a nonlinear component is connected between an output of the transmitter and an input of the TOR, where the system is configured to train a model of a frequency response of the transmitter and/or a model of a frequency response of the TOR according to another embodiment of the present disclosure.

FIG. 5 illustrates the system 98 of FIG. 4 according to another embodiment of the present disclosure. This embodiment is substantially the same as that of FIG. 4 but where the nonlinear component 106 is connected between the coupler 104 and the input of the TOR 102. In the case where the nonlinear component 106 is connected and disconnected via switches, the embodiment of FIG. 5 would remove the need to place the switches in the transmitter path (i.e., the path between the input of the transmitter 100 and the antenna 122). It should also be noted that, in this embodiment, the model of the second linear filter ($H_2(z)$) 114 does not include the coupled port of the coupler 104.

FIG. 6 illustrates a system 134 including a transmitter 136 and a TOR 138 coupled to an output of the transmitter 136 via a coupler 140 in which a nonlinear component 142 is connected between the coupler 140 and an input of the TOR 138 to enable training of a model of a frequency response of the transmitter 136 and a model of a frequency response of the TOR 138 according to one embodiment of the present disclosure. In this embodiment, the models of the frequency responses of the transmitter 136 and the TOR 138 are trained during normal operation of the transmitter 136 (i.e., during transmission of normal transmit signals rather than test signals). In one embodiment, the system 134 is the system 40 of FIG. 2 that is configured for training during normal operation by connecting the nonlinear component 142 between the coupler 46 and the input of the TOR 44 (FIG. 2). After training, the nonlinear component 142 can be disconnected. In another embodiment, the system 134 is the system 72 of FIG. 3 that is configured for training during normal operation by connecting the nonlinear component 142 between the coupler 78 and the input of the TOR 76 (FIG. 3). After training, the nonlinear component 142 can be disconnected. The nonlinear component 142 is connected and disconnected between the coupler 140 and the input of the TOR 138 using any suitable technique. For example, in one embodiment, the nonlinear component 142 is connected and disconnected via one or more switches. As another example, the nonlinear component 142 is connected via soldering or similar technique and disconnected by physically removing the nonlinear component 142 or otherwise destroying the connection made via soldering.

A frequency response of the transmitter 136, a nonlinear characteristic of the nonlinear component 142, and a frequency response of the TOR 138 are modeled by a combined model 144. Again, the combined model 144 is a 3-box model that is a concatenation or cascade of a model of a first linear filter ($H_1(z)$) 146, a model of a quasi-memoryless nonlinearity ($f(\cdot)$) 148, and a model of a second linear filter ($H_2(z)$) 150. Once the combined model 144 is trained, the model of the first linear filter ($H_1(z)$) 146 is a model of the frequency response of the transmitter 136, the model of the quasi-memoryless nonlinearity ($f(\cdot)$) 148 is a model of the nonlinear characteristic of the nonlinear component 142, and the model of the second linear filter ($H_2(z)$) 150 is a model of the frequency response of the TOR 138. The 3-box model forming the combined model 144 is also known as a Wiener-Hammerstein model. Techniques for determining parameters that define the 3-box model (i.e., both filter coefficients for the first and second linear filters ($H_1(z)$ and $H_2(z)$) 146 and 150 and the nonlinear characteristic of the quasi-memoryless nonlinearity $f(\cdot)$) 148 are known. For example, while not necessary for understanding the present disclosure, one exemplary and non-limiting technique for determining the parameters of the 3-box model is described in Dominique Schreurs et al., "RF Power Amplifier Behavioral Modeling," Cambridge University Press, Cambridge, UK, 2009. Any suitable technique for determining the parameters that define the 3-box model can be used to train the combined model 144 and, more particularly, the models of the first and second linear filters ($H_1(z)$ and $H_2(z)$) 146 and 150, which correspond to the models of the frequency responses of the transmitter 136 and the TOR 138, respectively.

In one embodiment, the nonlinear component 142 is quasi-memoryless. However, in another embodiment, the nonlinear characteristic of the nonlinear component 142 is known and characterized prior to training in which case the nonlinear component 142 may or may not be quasi-memoryless. If the nonlinearity characteristic of the nonlinear component 142 is known and characterized prior to training, training of the combined model 144 is simplified. If the nonlinearity characteristic of the nonlinear component 142 is not known prior to training, the nonlinearity characteristic of the nonlinear component 142 is also determined by training the combined model 144.

As illustrated, the transmitter 136 includes a DPD 152, a DAC 154, an upconversion subsystem 156, and a PA 158 connected as shown. An output of the transmitter 136 (i.e., an output of the PA 158) is coupled to an antenna 160 via a transmit filter 162. The output of the PA 158 is also coupled to an input of the nonlinear component 142 via the coupler 140, and an output of the nonlinear component 142 is coupled to the input of the TOR 138. The TOR 138 includes a downconversion subsystem 164 and an ADC 166 connected as shown. An output of the TOR 138 is coupled to a first input of a subtractor 168. The input of the transmitter 136 is coupled to an input of the combined model 144, and an output of the combined model 144 is coupled to a second input of the subtractor 168.

In order to train the combined model 144, a baseband processor 170 sends one or more digital transmit signals to the input of the transmitter 136 during normal operation. Notably, a linearization scheme of the transmitter 136, which in this embodiment is the DPD 152, is operational. Also note that, in this embodiment, the nonlinear component 142 cannot be placed in the transmit path as it would cause the transmitter 136 to exhibit strong nonlinear behavior. The digital transmit signal is predistorted by the DPD 152 to compensate for the nonlinearity of the PA 158, converted from digital to analog by the DAC 154, upconverted to a desired radio frequency by the upconversion subsystem 156, and amplified by the PA 158 to provide a radio frequency transmit signal at the output of the transmitter 136. The radio frequency transmit signal is passed to the antenna 160 via the transmit filter 162.

In addition, the radio frequency transmit signal is provided to the input of the nonlinear component 142 via the coupler 140. The radio frequency transmit signal is passed through the nonlinear component 142 to provide a nonlinear component output signal. The TOR 138 samples the nonlinear component output signal output by the nonlinear component 142 to provide a digital TOR output signal at the output of the TOR 138. More specifically, the nonlinear component output signal obtained from the output of the nonlinear component 142 is downconverted, preferably to baseband, by the downconversion subsystem 164 and analog to digital converted by the ADC 166 to thereby provide the digital TOR output signal at the output of the TOR 138.

The digital TOR output signal is provided to the first input of the subtractor 168. The digital transmit signal input to the transmitter 136 is also passed through the combined model 144 to provide an adjusted digital transmit signal to the second input of the subtractor 168. The subtractor 168 subtracts the adjusted digital transmit signal from the digital TOR output signal to provide an error signal. The baseband processor 170 processes the error signal to train the combined model 144. Once the combined model 144 is trained, the models of the first and second linear filters ($H_1(z)$ and $H_2(z)$) 146 and 150 correspond to the models of the frequency responses of the transmitter 136 and the TOR 138, respectively. It should be noted that while the combined model 144 is illustrated as a separate block, the combined model 144 (and the subtractor 168) may alternatively be implemented within the baseband processor 170.

FIG. 7 illustrates a process for training a model of a frequency response of a transmitter and a model of a frequency response of a TOR coupled to an output of the transmitter according to one embodiment of the present disclosure. First, a nonlinear component is connected between an output of the transmitter and an input of the TOR (step 1000). As discussed above, the nonlinear component may be connected between the output of the transmitter and a coupler that couples the output of the transmitter to the input of the TOR or connected between the coupler and the input of the TOR. Further, the nonlinear component may be connected using any suitable technique such as, for example, switches or soldering. The nonlinear component is preferably quasi-memoryless, but may alternatively not be quasi-memoryless if a nonlinearity characteristic of the nonlinear component is known and adequately characterized before training.

By connecting the nonlinear component between the output of the transmitter and the input of the TOR, a 3-box model can be used to model the frequency response of the transmitter, a nonlinear characteristic of the nonlinear component, and the frequency response of the TOR. More specifically, as discussed above, the 3-box model, which is also known as the Wiener-Hammerstein model, consists of concatenation or cascade of a model of a first linear filter ($H_1(z)$), a model of a quasi-memoryless nonlinearity ($f(\cdot)$), and a model of a second linear filter ($H_2(z)$). After training, the model of the first linear filter ($H_1(z)$) is the model of the frequency response of the transmitter, and the model of the second linear filter ($H_2(z)$) is the model of the frequency response of the TOR.

Once the nonlinear component is connected, a baseband processor sends an input signal through the transmitter (step 1002). In one embodiment, the input signal is a test signal. The test signal may consist of a continuous wave tone, two or more continuous wave tones at different frequencies, a modulated carrier, or two or more modulated carriers at different frequencies. The type of test signal will depend on the algorithm that is employed to train the 3-box model. Notably, for continuous wave tone(s), an amplitude of the continuous wave tone(s) may be varied to build a complete Amplitude Modulation to Amplitude Modulation (AM-AM) curve and a complete AM to Phase Modulation (AM-PM) curve if, for example, training is based on the Poza-Sarkozy-Berger (PSB) model. In another embodiment, the input signal sent through the transmitter is a transmit signal that is to be transmitted by the transmitter during normal operation.

The baseband processor then receives a signal via the TOR in response to sending the signal through the transmitter (step 1004). The signal received via the TOR may be, for example, an error signal representing a difference between a TOR output signal output by the TOR and an adjusted version of the signal input to the transmitter after passing through the 3-box model, as discussed above. The received signal may be at the same frequency as the signal sent through the transmitter (i.e., the fundamental frequency) or at the frequency of a harmonic or an intermodulation component. The baseband processor trains the 3-box model based on the input signal and the received signal output by the TOR (step 1006). While any suitable technique or algorithm for training the 3-box model can be used, in one particular embodiment, the 3-box model is trained based on measuring the AM-AM and AM-PM curves of the combined transmitter-nonlinear component-TOR chain and then determining the horizontal and vertical shifts of the curves relative to one another at different frequencies. This technique is based on the fundamental assumption of the PSB model and can be used to extract the magnitude frequency response of the transmitter and the magnitude and phase frequency response of the TOR.

In some embodiments, steps 1002 through 1006 are repeated for different frequencies (step 1008). In particular, in the case of continuous wave tones or narrowband modulated carriers, multiple test signals may be used such that the models of the frequency response of the transmitter and the frequency response of the TOR adequately represent the transmitter and the TOR over a desired frequency range. Once training is complete, the nonlinear component is disconnected (step 1010).

The following acronyms are used throughout this disclosure.
 ADC Analog-to-Digital Converter
 AM-AM Amplitude Modulation to Amplitude Modulation
 AM-PM Amplitude Modulation to Phase Modulation
 DAC Digital-to-Analog Converter
 DPD Digital Predistorter
 IMD InterModulation Distortion
 PA Power Amplifier
 PSB Poza-Sarkozy-Berger
 TOR Transmit Observation Receiver
 TX Transmit Those skilled in the art will recognize improvements and modifications to the preferred embodiments of the present disclosure. All such improvements and modifications are considered within the scope of the concepts disclosed herein and the claims that follow.

What is claimed is:

1. A method comprising:
 connecting a nonlinear component between an output of a transmitter and an input of a transmit observation receiver that is coupled to the output of the transmitter; and
 training a combined model of a frequency response of the transmitter, a nonlinear characteristic of the nonlinear component, and a frequency response of the transmit observation receiver using a signal generated from an input signal to the transmitter and an output signal of the transmit observation receiver, the combined model comprising concatenation of a model of a first linear filter that corresponds to a model of the frequency response of the transmitter, a model of a quasi-memoryless nonlinearity that represents a model of the nonlinear characteristic of the nonlinear component, and a model of a second linear filter that represents a model of the frequency response of the transmit observation receiver, wherein training the combined model improves performance of the transmitter.

2. The method of claim 1 further comprising disconnecting the nonlinear component after training the combined model.

3. The method of claim 1 wherein connecting the nonlinear component comprises connecting the nonlinear component between the output of the transmitter and a coupler that couples the output of the transmitter to the input of the transmit observation receiver.

4. The method of claim 1 wherein connecting the nonlinear component comprises connecting the nonlinear component between a coupler that couples the output of the transmitter to the input of the transmit observation receiver and the input of the transmit observation receiver.

5. The method of claim 1 wherein training the combined model of the frequency response of the transmitter, the nonlinear characteristic of the nonlinear component, and the frequency response of the transmit observation receiver comprises:
 providing one or more test signals to an input of the transmitter;
 receiving one or more observed test signals from an output of the transmit observation receiver in response to providing the one or more test signals to the input of the transmitter; and
 training the combined model based on the one or more test signals and the one or more observed test signals.

6. The method of claim 5 wherein the one or more test signals are small signals such that components of the transmitter operate linearly.

7. The method of claim 6 wherein the one or more test signals comprise a plurality of test signals at different frequencies.

8. The method of claim 1 wherein the transmitter comprises a digital predistortion subsystem, and training the combined model of the frequency response of the transmitter, the nonlinear characteristic of the nonlinear component, and the frequency response of the transmit observation receiver comprises training the combined model during normal operation while the digital predistortion subsystem is active.

9. The method of claim 8 wherein connecting the nonlinear component comprises connecting the nonlinear component between a coupler that couples the output of the transmitter to the input of the transmit observation receiver and the input of the transmit observation receiver.

10. The method of claim 1 further comprising, after training the combined model:
   disconnecting the nonlinear component; and
   applying an inverse of the model of the frequency response of the transmit observation receiver to an output signal of the transmit observation receiver during normal operation.

11. The method of claim 1 further comprising, after training the combined model:
   disconnecting the nonlinear component; and
   applying an inverse of the model of the frequency response of the transmitter to an input signal of the transmitter during normal operation.

12. The method of claim 1 wherein the nonlinear component has a known nonlinear characteristic, and training the combined model comprises training the combined model based on the known nonlinear characteristic of the nonlinear component.

13. The method of claim 1 wherein the nonlinear component is a quasi-memoryless nonlinear component.

14. A system comprising:
   a transmitter;
   a transmit observation receiver having an input that is coupled to an output of the transmitter;
   a nonlinear component connected between the output of the transmitter and the input of the transmit observation receiver; and
   a baseband processor configured to train a combined model of a frequency response of the transmitter, a nonlinear characteristic of the nonlinear component, and a frequency response of the transmit observation receiver, the combined model comprising concatenation of a model of a first linear filter that corresponds to a model of the frequency response of the transmitter, a model of a quasi-memoryless nonlinearity that represents a model of the nonlinear characteristic of the nonlinear component, and a model of a second linear filter that represents a model of the frequency response of the transmit observation receiver.

15. The system of claim 14 wherein the nonlinear component is disconnected after the combined model is trained.

16. The system of claim 14 wherein the nonlinear component is connected between the output of the transmitter and a coupler that couples the output of the transmitter to the input of the transmit observation receiver.

17. The system of claim 14 wherein the nonlinear component is connected between a coupler that couples the output of the transmitter to the input of the transmit observation receiver and the input of the transmit observation receiver.

18. The system of claim 14 wherein, in order to train the combined model, the baseband processor is further configured to:
   provide one or more test signals to an input of the transmitter;
   receive one or more observed test signals from an output of the transmit observation receiver in response to providing the one or more test signals to the input of the transmitter; and
   train the combined model based on the one or more test signals and the one or more observed test signals.

19. The system of claim 18 wherein the one or more test signals are small signals such that components of the transmitter operate linearly.

20. The system of claim 19 wherein the one or more test signals comprise a plurality of test signals at different frequencies.

21. The system of claim 14 wherein the transmitter comprises a digital predistortion subsystem, and the baseband processor is configured to train the combined model during normal operation while the digital predistortion subsystem is active.

22. The system of claim 21 wherein the nonlinear component is connected between a coupler that couples the output of the transmitter to the input of the transmit observation receiver and the input of the transmit observation receiver.

23. The system of claim 14 wherein, after the combined model is trained, the nonlinear component is disconnected, and an inverse model component applies an inverse of the model of the frequency response of the transmit observation receiver to an output signal of the transmit observation receiver during normal operation.

24. The system of claim 14 wherein, after the combined model is trained, the nonlinear component is disconnected, and an inverse model component applies an inverse of the model of the frequency response of the transmitter to an input signal of the transmitter during normal operation.

25. The system of claim 14 wherein the nonlinear component has a known nonlinear characteristic, and the baseband processor is configured to train the combined model based on the known nonlinear characteristic of the nonlinear component.

26. The system of claim 14 wherein the nonlinear component is a quasi-memoryless nonlinear component.

* * * * *